United States Patent
Zenati et al.

(10) Patent No.: US 12,024,101 B2
(45) Date of Patent: Jul. 2, 2024

(54) SEALED POWER DISTRIBUTION UNIT FOR AN ELECTRICAL POWER DISTRIBUTION SYSTEM

(71) Applicant: SAFT AMERICA, Cockeysville, MD (US)

(72) Inventors: Ali Zenati, Jacksonville, FL (US); Theodore Brown, Jacksonville, FL (US); James A. Markert, Jacksonville, FL (US)

(73) Assignee: SAFT AMERICA, Cockeysville, MD (US)

( * ) Notice: Subject to any disclaimer, the term of this patent is extended or adjusted under 35 U.S.C. 154(b) by 91 days.

(21) Appl. No.: 17/851,859

(22) Filed: Jun. 28, 2022

(65) Prior Publication Data
US 2023/0415679 A1    Dec. 28, 2023

(51) Int. Cl.
*B60R 16/023*    (2006.01)
*H01M 10/42*    (2006.01)
*H05K 7/14*    (2006.01)

(52) U.S. Cl.
CPC ....... *B60R 16/0238* (2013.01); *H01M 10/425* (2013.01); *H05K 7/1432* (2013.01); *H01M 2010/4271* (2013.01)

(58) Field of Classification Search
CPC ............ B60R 16/0238; H01M 10/425; H01M 2010/4271; H05K 7/1432
USPC .................................................. 307/10.1, 9.1
See application file for complete search history.

(56) References Cited

U.S. PATENT DOCUMENTS

| | | | |
|---|---|---|---|
| 5,504,655 A * | 4/1996 | Underwood | |
| 8,927,128 B2 * | 1/2015 | Kuroda | H01M 2/12 |
| 9,718,420 B1 | 8/2017 | Sun | |
| 2004/0235318 A1 * | 11/2004 | Yamada | H01R 12/00 |

FOREIGN PATENT DOCUMENTS

| | | |
|---|---|---|
| CN | 208035956 U | 11/2018 |
| CN | 212934766 U | 4/2021 |
| EP | 2 843 798 A1 | 3/2015 |
| EP | 3 932 720 A1 | 1/2022 |

* cited by examiner

Primary Examiner — Rexford N Barnie
Assistant Examiner — Swarna N Chowdhuri
(74) Attorney, Agent, or Firm — Sughrue Mion, PLLC (57) ABSTRACT

A power distribution unit for a vehicle including an enclosure and power distributing means for distributing electrical power between a battery and a load application, the enclosure including an external casing and an internal casing having a faceplate and a mounting plate, the mounting plate having upper dielectric partitions protruding upward from a top face of the mounting plate, and the power distributing means being mounted on the mounting plate, wherein the upper dielectric partitions are configured to both maintain a separation between different voltage groups and define an insulating barrier between components of the power distributing means, the internal cartridge is configured to be inserted into the external casing, and the enclosure is configured to be sealed from an external environment.

13 Claims, 7 Drawing Sheets

SEALED POWER DISTRIBUTION UNIT FOR AN ELECTRICAL POWER DISTRIBUTION SYSTEM

BACKGROUND OF THE INVENTION

The present disclosure is directed to a power distribution unit, and in particular to a power distribution unit for an electrical power distribution system for example for vehicle applications.

Conventionally, power distribution units, also known as PDUs, include internal components that require some form of protection from the environment and restricts access to the high voltages contained within. Power distribution units for use in mobility systems, specifically vehicles, are typically designed where the vehicle provides most, if not all, of the protection for the internal components. However, in many of these mobility systems, the power distribution unit is developed in parallel with the application that they serve and result in power distribution units being positioned in relatively inaccessible area of vehicles. This results in unique challenges with respect to serviceability and leads to increased maintenance time.

The present disclosure provides a power distribution unit that, with a simple configuration, merges the functions of the application interface, component layout, mechanical fixation and environmental sealing. The retention of the components is accomplished by mounting functional elements together on a single component and fastening said single component at a single surface to minimize time and effort necessary to gain access to the functional elements.

Additionally, the modular design of the power distribution unit allows the power distribution unit to be mounted remotely from their battery sources, which creates easier servicing and maintenance on the electrical power distribution system without creating direct exposure to the high voltage of the battery sources.

SUMMARY OF THE INVENTION

According to an aspect of an example embodiment, a power distribution unit may include an enclosure; and power distributing means for distributing electrical power between a battery and a load application, wherein the enclosure may include: an external casing having a closed end, an open end, a top surface, a bottom surface and opposing side surfaces, each of the opposing side surfaces having a support slot, and the bottom surface having one or more alignment guide; and an internal casing having a faceplate and a mounting plate, the mounting plate extending rearward from the faceplate, opposing sides of the mounting plate being configured to be slidably disposed within the support slots, the mounting plate having upper dielectric partitions protruding upwardly from a top face of the mounting plate and lower dielectric partitions protruding downwardly from a bottom face of the mounting plate, wherein the internal cartridge is configured to be inserted into the external casing through the open end, wherein the faceplate has a plurality of external interfaces adapted for connecting to the battery and the load application, wherein the power distributing means is mounted on the mounting plate, wherein the enclosure is configured to be sealed from an external environment, and wherein the upper and lower dielectric partitions are configured to both maintain a separation between different voltage groups and define an insulating barrier between components of the power distributing means.

Further, the internal cartridge may be configured to slide on the one or more alignment guide such that the mounting plate is engaged with the support slots.

Further, the external casing may include a sealing surface disposed around a rim of the open end. The sealing surface may be configured to create a seal between the external casing and the internal cartridge.

The rim and the faceplate may include a plurality of corresponding holes for fastening the internal cartridge to the external casing.

Further, the enclosure may include a gasket for creating a seal between the external casing and the internal cartridge.

The power distributing means may include one or more selected from the group consisting of a contactor, a pre-charge circuit, a fuse, a plurality of sensors.

In an example embodiment, the external casing and the internal cartridge may be made from plastic.

According to an example embodiment, the internal cartridge may further include a lower mounting plate that extends rearward from a rear end of a lower dielectric partition.

Further, each of the opposing side surfaces may further comprise a lower support slot, opposing sides of the lower mounting plate being configured to be slidably disposed within the lower support slots.

The power distributing means may include a plurality of electrical components, and some of the electrical components may be mounted to the mounting plate and some of the electrical components may be mounted to the lower mounting plate.

According to an example embodiment, the one or more alignment guide may protrude upwardly from the bottom surface of the external casing and taper towards the open end. The lower mounting plate may be configured to slide on the one or more alignment guide.

The lower mounting plate may include protrusions configured to provide support for the power distributing means.

The power distribution unit may further include a battery management unit (BMU) configured to monitor status of the battery, the BMU may be mounted to the mounting plate, and the faceplate may have a connector for connecting to the BMU.

According to an example embodiment, the power distributing means may include a positive contactor, a negative contactor, a pre-charge resistor, a pre-charge contactor, a first fuse corresponding to the positive contactor, a second fuse corresponding to the negative contactor, a current sensor, and a battery management unit (BMU).

Also, a vehicle of the present disclosure may include the power distribution unit having any one of the above-described configurations.

BRIEF DESCRIPTION OF THE DRAWINGS

Further features, nature, and various advantages of the disclosed subject matter will be more apparent from the following detailed description and the accompanying drawings in which.

DETAILED DESCRIPTION OF THE INVENTION

Detailed embodiments of the claimed structures are disclosed herein; however, it can be understood that the disclosed embodiments are merely illustrative of the claimed structures that may be embodied in various forms. Aspects of this disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Referring to the figures, the invention relates to a power distribution unit configured to simplify assembly and maintenance of the power distribution unit for use in a vehicle, and provide environmental protection for electrical components disposed within.

Figure 1:
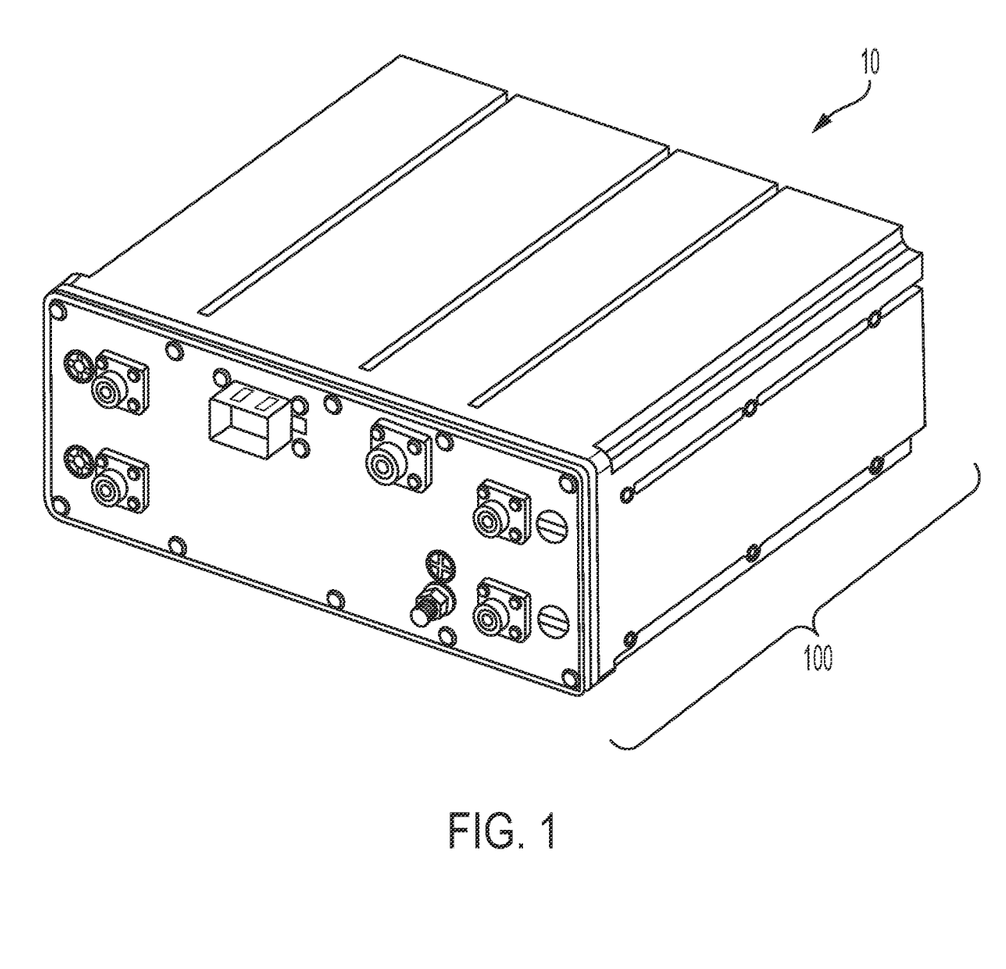
FIG. 1 is a perspective view of the power distribution unit in a sealed position
Figure 2:
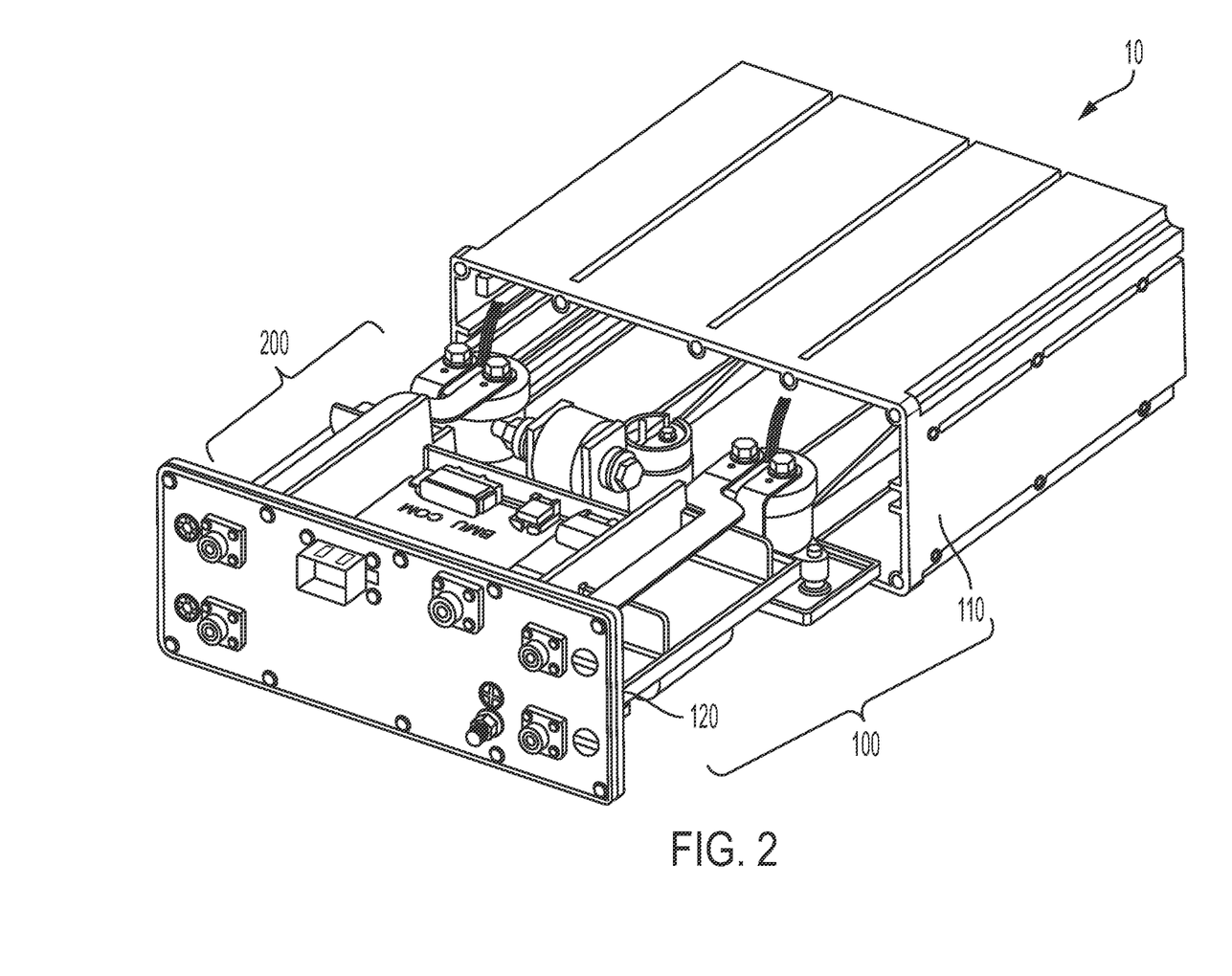
FIG. 2 is a perspective view of the power distribution unit with the enclosure separated and the power distribution means for distributing electrical power exposed.

As shown in FIG. 1 and FIG. 2, the power distribution unit 10 includes an enclosure 100 and means for distributing electrical power between a battery to a load application 200 (hereinafter "power distributing means"). The enclosure 100, including an external casing 110 and an internal cartridge 120, provides protection for the power distributing means 200 and restricts external access to the high voltages within. For example, the enclosure 100 can provide protection from shock, vibration, extreme temperatures, water spray, and the like.

The enclosure 100 may be made of any suitable materials, but are preferably made of materials that provide adequate electrical insulation and environmental protection. In an example embodiment, the enclosure 100 is made up of plastic, which provides adequate insulation and environmental protection while also being low in cost and weight.

Figure 3:
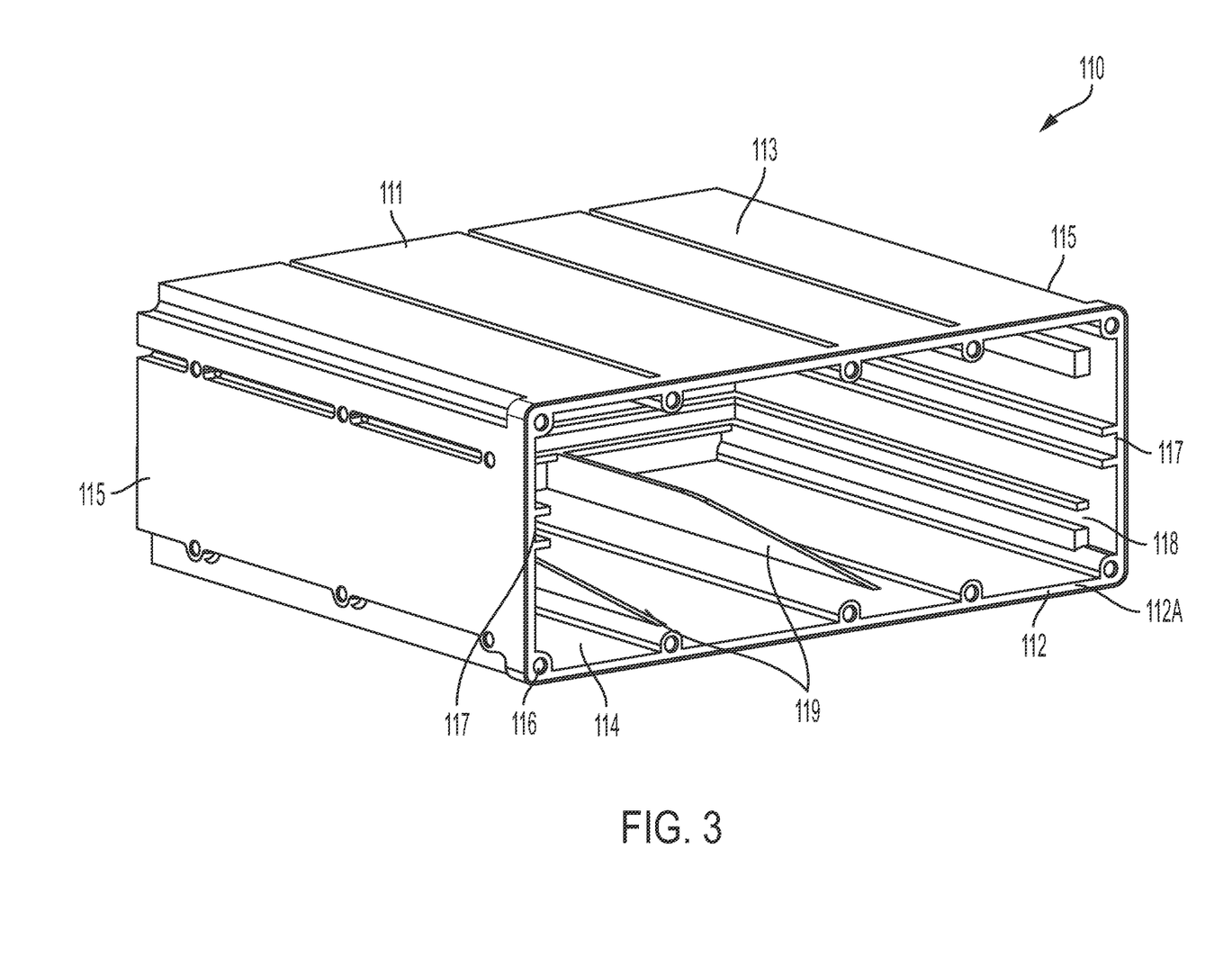
FIG. 3 is a perspective view of the external casing.

FIG. 3 shows a perspective view of the external casing 110. The external casing 110 includes a closed end 111, an open end 112, a top surface 113, a bottom surface 114 and opposing side surfaces 115. The external casing further includes a rim 112A around the open end 112, which serves as a surface for fixing the internal cartridge 120 in the external casing 110 and sealing the enclosure 100 from external environments. In an example embodiment, as shown in FIG. 3, the rim may include a plurality of screw holes for fastening the internal cartridge 120 to the external casing 110 for sealing the enclosure.

The opposing side surfaces 115 of the external casing 110 each has a support slot 117 for receiving the internal cartridge 120. The bottom surface 114 of the casing 110 may also have a support slot 117. The support slots 117 are configured to provide support for the internal cartridge 120 within the external casing 110 and restrict excessive movement of the internal cartridge 120 inside of the external casing 110. Although this is merely an example, the support slots 117 in FIG. 3 extend a full length from the open end 112 to the closed end 111. However, the length and position of the support slots 117 are not limited thereto.

The external casing 110 may further include lower support slots 118. As shown in FIG. 3, the lower support slots 118 may be positioned below the support slots 117 on the opposing side surfaces 115. The lower support slots 118 may provide additional alignment for the internal cartridge 120 as it is inserted into the external casing 110 and additional support for the internal cartridge 120 when it is fixed within the external cartridge 110.

The bottom surface 114 of the external casing 110 has one or more alignment guides 119 for guiding the internal cartridge 120 during insertion into the external casing 110. The one or more alignment guide 119 may be inclined such that the height is increased toward the closed end 111 of the external casing 110 and tapers at the open end 112 of the external casing 110. Although the external casing 110 is shown in FIG. 3 as having two alignment guides 119 spaced equally on the bottom surface 114, the quantity and arrangement of the one or more alignment guide 119 is not limited thereto.

Figure 4:
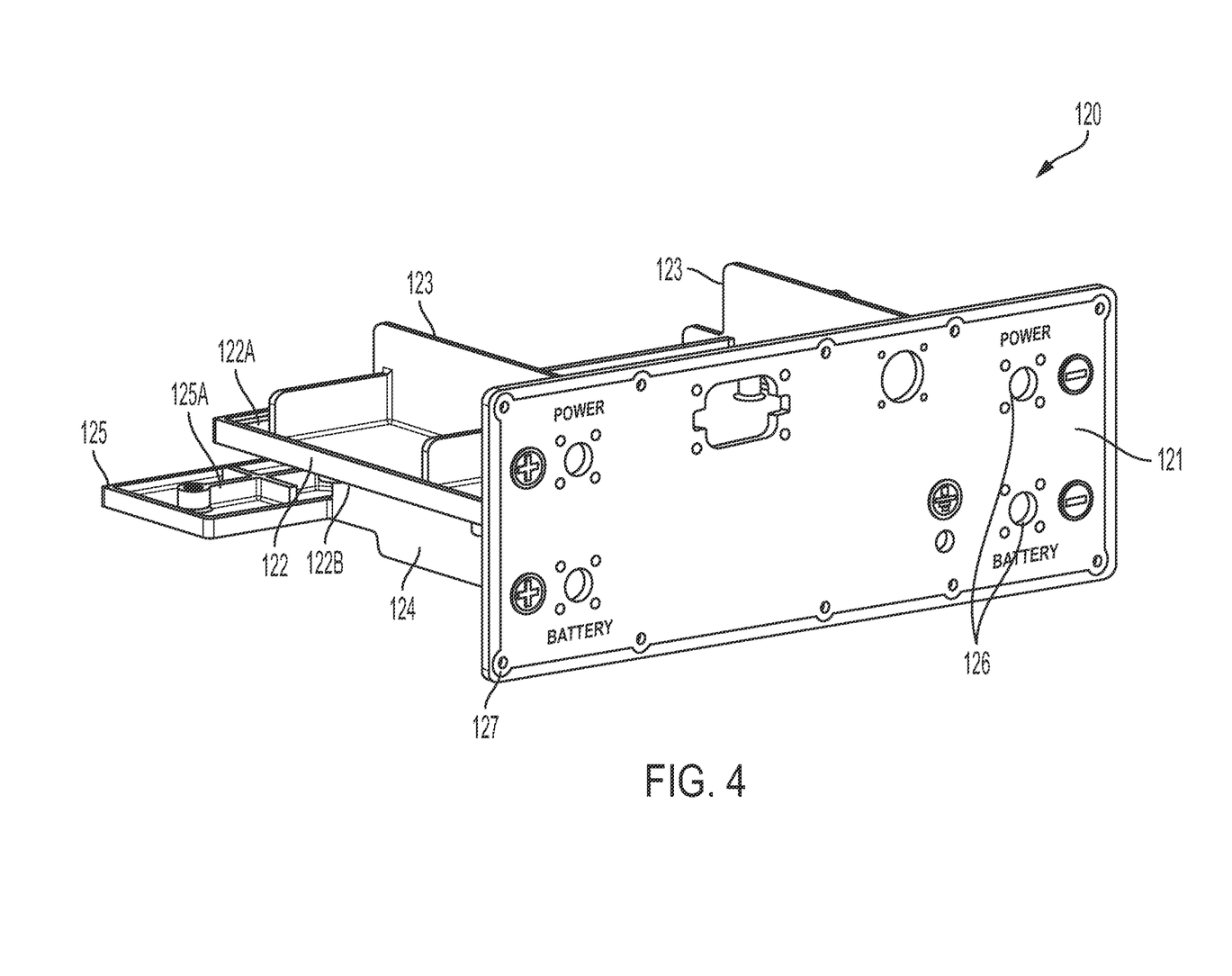
FIG. 4 is a perspective view of the internal cartridge.

FIG. 4 shows a perspective view of the internal cartridge 120. The internal cartridge 120 includes a faceplate 121 and a mounting plate 122 on which the power distributing means 200 are mounted. The mounting plate 122 of the internal cartridge 120 extends rearward from the faceplate 121 and is configured such that opposing sides of the mounting plate 122 can be slidably disposed within the support slots 117 of the external casing 110.

The faceplate 121 includes a plurality of external interfaces 126 adapted for connecting to the battery and to the load application. The plurality of external interfaces may include interface holes for electrical connectors, or the like. Additionally, the faceplate 121 may also include a plurality of fastening holes 127 for fastening the internal cartridge 120 to the external casing 110.

Figure 5:
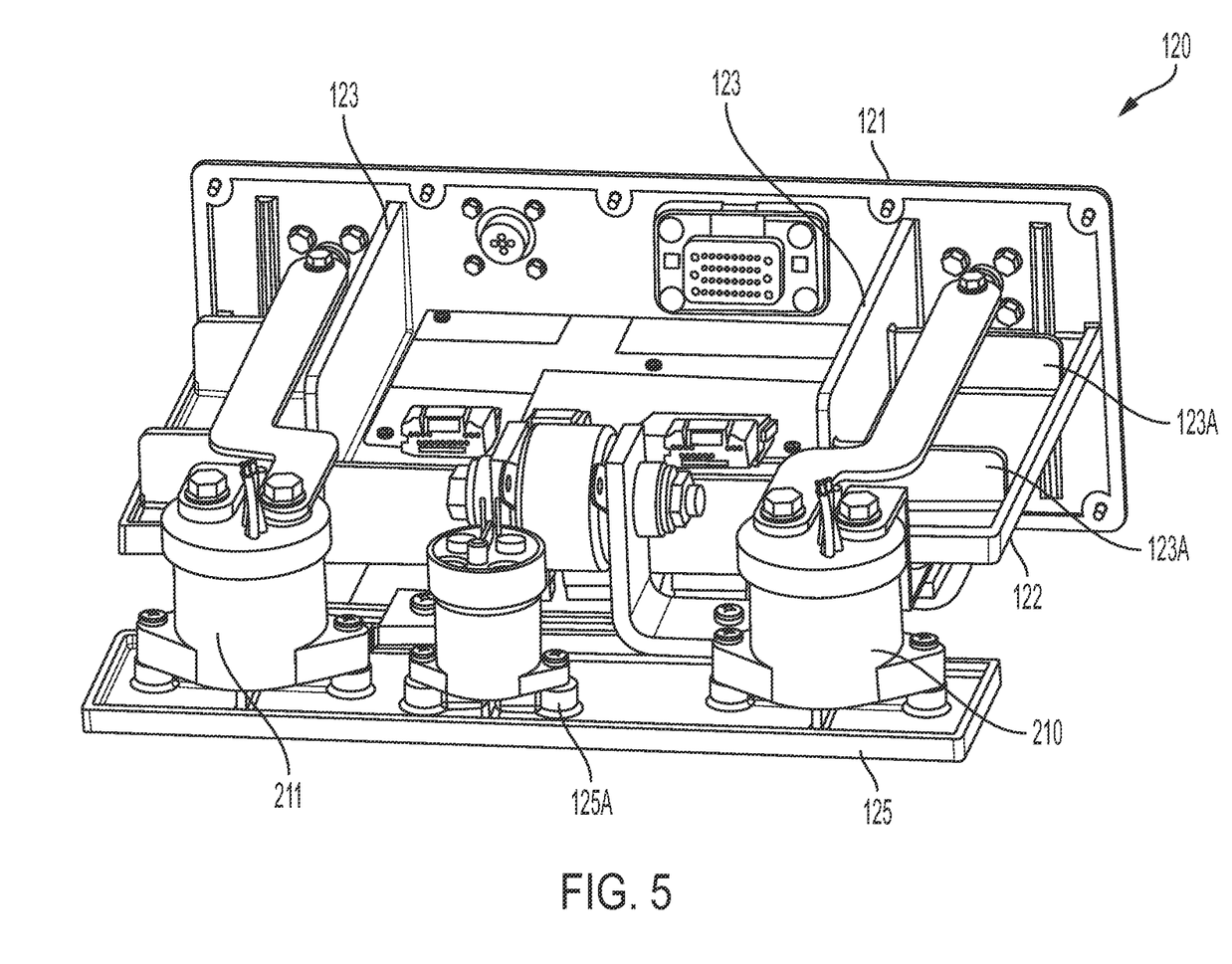
FIG. 5 is a perspective view of the internal cartridge with the power distributing means mounted.

The mounting plate 122 includes upper dielectric partitions 123 extending upward from a top face 122A and lower dielectric partitions 124 extending downward from a bottom face 122B. The upper dielectric partitions 123 and the lower dielectric partitions 124 provide barriers across the mounting plate 122 for isolating the power distributing means 200. The upper dielectric partitions and the lower dielectric partitions create distance between positively charged electrical components and negatively charged electrical components of the power distributing means 200 and create insulating barriers between the positively charged electrical components and the negatively charged electrical components In addition, as shown in FIG. 5, the mounting plate may include a plurality of support protrusions 123A for supporting the electrical components of the power distributing means 200 on the mounting plate 122.

In an example embodiment, the internal cartridge 120 may further include a lower mounting plate 125 that extends rearward from the lower dielectric partitions 124 and in which opposing sides of the lower mounting plate 125 can be slidably disposed within the lower support slots 118 of the external casing 110. Additionally, as shown in FIGS. 4 and 5, the lower mounting plate 125 may also have protrusions 125A for supporting the power distributing means 200.

The power distributing means 200 may include a plurality of electrical components configured to manage the interconnection of an electrical supply, such as a battery, battery pack or module, or the like, and a load application. The plurality of electrical components are connected to the electrical supply and the output device by way of the plurality of external interfaces on the faceplate 121 of the internal cartridge 120.

The plurality of electrical components may include, for example, one or more of a high voltage contactor, a pre-charge circuit, including pre-charge resistors and pre-charge contactors, a high voltage fuse, one or more sensor, and control electronics. For example, the control electronics may include a battery management unit (BMU) for monitoring the status of the battery. The plurality of electrical components may also include connection components such as connectors and wires.

Figure 6:
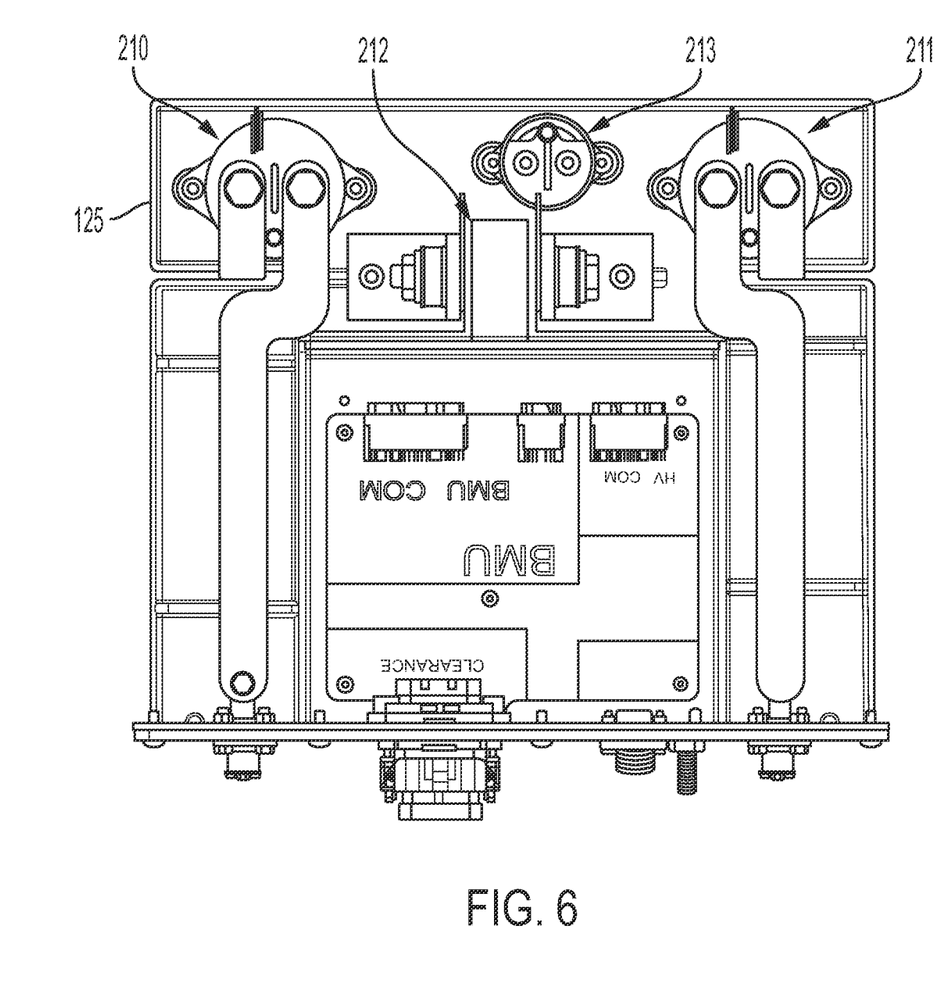
FIG. 6 is a top view of the internal cartridge with the power distributing means mounted of an example embodiment.
Figure 7:
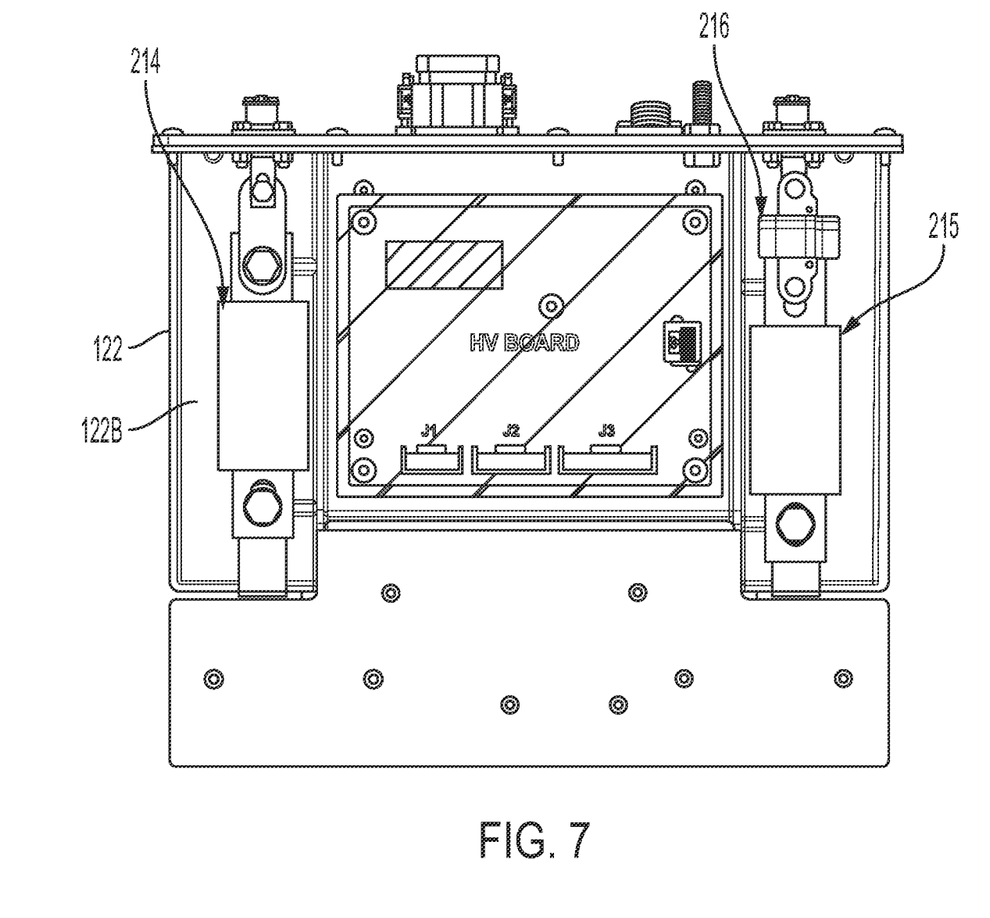
FIG. 7 is a bottom view of the internal cartridge with the power distributing means mounted of an example embodiment.

In an example embodiment, as shown in FIGS. 6 and 7, the plurality of electrical components includes a positive contactor 210, a negative contactor 210, a pre-charge resistor 212, a pre-charge contactor 213, a first fuse 214 corresponding to the positive contactor 210, a second fuse 215 corresponding to the negative contactor 211, a current sensor 216, a circuit board 217, and a BMU (not shown). The positive contactor 210, the negative contactor 211, the pre-charge resistor 212, and the pre-charge contactor 213 may be mounted to the lower mounting plate 125, and the first fuse 214, the second fuse 215, and the current sensor may be mounted on the bottom surface 122B of the mounting plate 122.

The plurality of electrical components can be mounted to the mounting plate 122 with the positively charged electrical components and the negatively charged electrical components isolated from each other. In an example embodiment, as shown in FIGS. 5 and 6, the positive contactor 210 and the negative contactor 211 are mounted on opposite sides of the internal cartridge 120 with the upper dielectric partitions 123 positioned in between the positively and negatively charged electrical components.

The power distributing means 200 are mounted to the mounting plate 122 of the internal cartridge 120. Additionally, in an embodiment including the lower mounting plate 125 as shown in FIGS. 5 and 6, the power distributing means 200 can be mounted to both the mounting plate 122 and the lower mounting plate 125. In this configuration, the power distributing means 200 can be compiled at a single location and the overall assembly of the power distributing means 200 onto the internal cartridge 121 can be simplified.

The power distribution unit 10 is assembled by inserting the internal cartridge 120 through the open end 112 of the external casing 110. As the internal cartridge 120 is inserted into the external casing 110, the mounting plate 122 slides along the one or more alignment guide 119 and the opposing sides of the mounting plate 122 engage with the support slots 117. In an example embodiment, when the internal cartridge 120 with the lower mounting plate 125 is inserted into the external casing 110 with the lower support slot 118, the lower mounting plate 125 makes contact with the one or more alignment guide 119, the opposing sides of the lower mounting plate 125 engage with the lower support slots 118, and the opposing sides of the mounting plate 122 engage with the support slots 117.

The internal cartridge 120 slides into the external casing 110 until the faceplate 121 makes contact with the rim 112A of the open end 112. The contact between the faceplate 121 and the rim 112A seals the enclosure 100 as the internal cartridge 120 is fixed to the external casing 110. In an example embodiment, a gasket may be placed between the rim 112A and the faceplate 121 to perform the sealing of the enclosure 100.

In this configuration, the power distributing means 200 can be protected from the external environment inside the enclosure 110. Additionally, the modularity of the power distribution unit 10 allows for the power distribution unit 10 to be mounted remotely in the vehicle from the battery, which provides easier servicing or maintenance without exposing persons to a high voltage of the battery directly.

The power distribution unit 10 can be disassembled by removing the internal cartridge 120 from the external casing 110 in a reversed process. The opposing sides of the mounting plate 122 can slide outward along the support slots and the mounting plate 122 can slide outward along the one or more alignment guides 119 while the external casing 110 remains fixed in the vehicle.

Further, in this configuration, the power distribution unit 10 can be mounted in the vehicle with the faceplate 121 facing an upward direction such that, during disassembly, the internal cartridge 120 can be loosened and removed, removing all of the power distributing means 200 at once, without needing to remove the entire power distribution unit 10 from the vehicle.

The present disclosure is not limited to the above description, and various other modifications may be implemented within a range not departing from the spirit of the present disclosure.

What is claimed is:

1. A power distribution unit, comprising:
an enclosure; and
power distributing means for distributing electrical power between a battery to a load application,
wherein the enclosure comprises:
an external casing having a closed end, an open end, a top surface, a bottom surface and opposing side surfaces, each of the opposing side surfaces having a support slot, and the bottom surface having one or more alignment guide; and
an internal cartridge having a faceplate and a mounting plate, the mounting plate extending rearward from the faceplate, opposing sides of the mounting plate being configured to be slidably disposed within the support slots, the mounting plate having upper dielectric partitions protruding upwardly from a top face of the mounting plate and lower dielectric partitions protruding downwardly from a bottom face of the mounting plate,
wherein the internal cartridge is configured to be inserted into the external casing through the open end,
wherein the faceplate has a plurality of external interfaces adapted for connecting to the battery and to the load application,
wherein the power distributing means is mounted on the mounting plate,
wherein the enclosure is configured to be sealed from an external environment,
wherein the upper and lower dielectric partitions are configured to both maintain a separation between different voltage groups and define an insulating barrier between components of the power distributing means,
wherein the internal cartridge comprises a lower mounting plate that extends rearward from a rear end of a lower dielectric partition, and
wherein each of the opposing side surfaces further comprise a lower support slot, opposing sides of the lower mounting plate being configured to be slidably disposed within the lower support slots.

2. The power distribution unit according to claim 1, wherein the internal cartridge is configured to slide on the one or more alignment guide such that the mounting plate is engaged with the support slots.

3. The power distribution unit according to claim 1, wherein the external casing further comprises a sealing surface disposed around a rim of the open end, the sealing surface being configured to create a seal between the external casing and the internal cartridge.

4. The power distribution unit according to claim 3, wherein the rim and the faceplate comprise a plurality of corresponding holes for fastening the internal cartridge to the external casing.

5. The power distribution unit according to claim 1, wherein the enclosure comprises a gasket for creating a seal between the external casing and the internal cartridge.

6. The power distribution unit according to claim 1, wherein the power distributing means includes one or more selected from the group consisting of a contactor, a pre-charge circuit, a fuse, and a plurality of sensors.

7. The power distribution unit according to claim 1 wherein the external casing and the internal cartridge are made from plastic.

8. The power distribution unit according to claim 1, wherein the power distributing means comprises a plurality of electrical components, and some of the electrical components are mounted to the mounting plate and some of the electrical components are mounted to the lower mounting plate.

9. The power distribution unit according to claim 1, wherein the one or more alignment guide protrudes upwardly from the bottom surface of the external casing and tapers towards the open end, the lower mounting plate is configured to slide on the one or more alignment guide.

10. The power distribution unit according to claim 8, wherein the lower mounting plate comprises protrusions configured to provide support for the power distributing means.

11. The power distribution unit according to claim 1, further comprising a battery management unit (BMU) configured to monitor status of the battery, the BMU being mounted to the mounting plate, and the faceplate having a connector for distributing electrical power between to the BMU.

12. The power distribution unit according to claim 1, wherein the power distributing means comprises a positive contactor, a negative contactor, a pre-charge resistor, a pre-charge contactor, a first fuse corresponding to the positive contactor, a second fuse corresponding to the negative contactor, and a current sensor.

13. A system comprising:

a battery pack; and the power distribution unit according to claim 1.

* * * * *